(12) United States Patent
Ide et al.

(10) Patent No.: US 9,257,812 B2
(45) Date of Patent: Feb. 9, 2016

(54) LASER MODULE, LIGHT SOURCE DEVICE, AND METHOD FOR FABRICATING LASER MODULE

(71) Applicant: CITIZEN HOLDINGS CO., LTD., Tokyo (JP)

(72) Inventors: Masafumi Ide, Saitama (JP); Kaoru Yoda, Nagano (JP); Shinpei Fukaya, Saitama (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/427,258

(22) PCT Filed: Jun. 17, 2014

(86) PCT No.: PCT/JP2014/066072
§ 371 (c)(1),
(2) Date: Mar. 10, 2015

(87) PCT Pub. No.: WO2015/012025
PCT Pub. Date: Jan. 29, 2015

(65) Prior Publication Data
US 2015/0236472 A1 Aug. 20, 2015

(30) Foreign Application Priority Data

Jul. 26, 2013 (JP) ................................ 2013-156099
Nov. 29, 2013 (JP) ................................ 2013-248192

(51) Int. Cl.
*H01S 5/00* (2006.01)
*H01S 5/026* (2006.01)
*H01S 5/40* (2006.01)
*F21V 8/00* (2006.01)
(Continued)

(52) U.S. Cl.
CPC ............ *H01S 5/0014* (2013.01); *G02B 6/0005* (2013.01); *G02B 27/0172* (2013.01);*H01S5/026* (2013.01); *H01S 5/0218* (2013.01); *H01S 5/0261* (2013.01); *H01S 5/40* (2013.01); *H01S 5/4012* (2013.01); *H01S 5/4025* (2013.01); *G02B 2027/0178* (2013.01)

(58) Field of Classification Search
CPC ..... H01S 5/0014; H01S 5/0261; H01S 5/026; H01S 5/4012; H01S 5/4025; H01S 5/40; H01S 5/0218
USPC ...................... 372/50.12, 50.121, 50.1, 38.02
See application file for complete search history.

(56) References Cited

U.S. PATENT DOCUMENTS

| 5,548,677 A | 8/1996 | Kakii et al. |
| 2002/0076841 A1* | 6/2002 | Chang ................... H01S 5/0014 438/15 |

(Continued)

FOREIGN PATENT DOCUMENTS

| JP | H06-059168 A | 3/1994 |
| JP | H06-186457 A | 7/1994 |

(Continued)

OTHER PUBLICATIONS

International Search Report for PCT/JP2014/066072, Aug. 19, 2014.

*Primary Examiner* — Kinam Park

(57) ABSTRACT

Provided is a laser module wherein any defective laser device can be isolated by performing burn-in on laser devices mounted on a mounting substrate. The laser module includes laser devices that emit laser light, a driver IC for driving the laser devices, a mounting substrate on which the laser devices and the driver IC are mounted, a common electrode terminal to which a common electrode of the laser devices is connected, individual electrode terminals to which individual electrodes of the laser devices are respectively connected, driver terminals to which the driver IC is connected, and test terminals which are respectively connected to the common electrode terminal and the individual electrode terminals, and to which an external power supply is to be connected when performing burn-in of the laser devices, wherein the number of the laser devices and the number of the test terminals are each larger than the number of the driver terminals.

11 Claims, 13 Drawing Sheets

(51) Int. Cl.
*G02B 27/01* (2006.01)
*H01S 5/02* (2006.01)

(56) References Cited

U.S. PATENT DOCUMENTS

2011/0102537 A1* 5/2011 Griffin .................. B41J 2/45
　　　　　　　　　　　　　　　　　　　　　347/237
2012/0328229 A1　12/2012　Kogo et al.

FOREIGN PATENT DOCUMENTS

| | | |
|---|---|---|
| JP | H07-209556 A | 8/1995 |
| JP | 2001-007403 A | 1/2001 |
| JP | 2002-261398 A | 9/2002 |
| JP | 2002-319731 A | 10/2002 |
| JP | 2007-194288 A | 8/2007 |
| JP | 2008-225185 A | 9/2008 |
| JP | 2013-008887 A | 1/2013 |

* cited by examiner

025 # LASER MODULE, LIGHT SOURCE DEVICE, AND METHOD FOR FABRICATING LASER MODULE

TECHNICAL FIELD

The present invention relates to a laser module with laser devices mounted on a substrate, a light source device incorporating the laser module, and a method for fabricating the laser module.

BACKGROUND ART

Laser modules used as light sources in applications such as projectors that project multicolor images, for example, incorporate laser light sources of three colors, red, green, and blue (RGB). Among others, in volumetric displays or the like that project stereoscopic images, a plurality of LD (Laser Diode) devices of the same wavelength must be provided in order to project (spatially multiplex) images at different depth positions for each color. In such applications, therefore, a laser module having multiple LD arrays, one for each wavelength, is used as the light source device.

Since a batch of LD devices produced as laser light sources generally contains a certain percentage of defectives, a burn-in test for sorting out early defectives by measuring various characteristics while driving the LD devices in a high-temperature environment is conducted at the time the laser module containing the LD devices is fabricated.

Patent document 1 discloses a burn-in apparatus for performing the burn-in of integrated semiconductor laser devices. The burn-in apparatus includes a thermostatic chamber capable of accommodating a plurality of integrated semiconductor laser devices, photodiodes each for receiving light emitted from a corresponding one of semiconductor lasers, laser connecting lines each connected to the p-side electrode of each individual one of the semiconductor lasers, a multichannel selector for selecting lines that supply current from among the laser connecting lines, PD connecting lines each connected to each individual one of the photodiodes, a multichannel power supply for supplying current to the laser connecting lines selected by the multichannel selector, and a temperature controller for controlling the temperature of the thermostatic chamber.

Patent documents 2 and 3 each disclose an array-type laser module for optical communications which is constructed by arranging LD arrays, arrayed optical waveguides, optical fiber arrays, etc., on a substrate. In the case of laser modules for optical communications, LD devices of different wavelengths are configured into arrays in order to perform wavelength multiplexing. In such optical communications laser modules, if even one of the LD devices is rendered defective, the whole module will be rendered defective because the wavelength corresponding to that LD device cannot be obtained. In view of this, in order to increase the percentage of non-defective laser modules, it is known to design the LD array with redundancy by accounting for the production yield, so that non-defective devices are selected from the LD array and only the selected devices are optically coupled to an optical fiber array (for example, refer to patent documents 4 and 5).

Patent document 4 discloses an optical array link module which includes an LD array constructed by arraying a plurality of LDs the number of which is made larger than the required number of channels by accounting for a certain percentage of defectives, an optical fiber arrayed cable constructed by arraying optical fibers one for each LD, and a lens array constructed by arraying lenses one for each LD and interposed between the LD array and the optical fiber arrayed cable so as to optically couple the LD array to the optical fiber arrayed cable in a desired manner. In this module, any optical fiber corresponding to a defective LD in the LD array is cut to isolate the defective, and the optical fibers equal in number to the desired number of channels are used as working fibers.

PRIOR ART DOCUMENTS

Patent Documents

Patent document 1: Japanese Unexamined Patent Publication No. 2007-194288
Patent document 2: Japanese Unexamined Patent Publication No. 2001-007403
Patent document 3: Japanese Unexamined Patent Publication No. H07-209556
Patent document 4: Japanese Unexamined Patent Publication No. H06-059168
Patent document 5: Japanese Unexamined Patent Publication No. H06-186457

SUMMARY OF INVENTION

Generally, the laser devices contained in a laser module are subjected to a burn-in test, not in chip form but after being mounted onto a heat-dissipating substrate and assembled into the laser module. As a result, if even one of the plurality of laser devices thus mounted is found defective, the entire laser module will be rendered defective even when the other laser devices are non-defective. Therefore, from the standpoint of improving the fabrication yield of the laser module, it is desirable that the laser module can be rendered non-defective by performing a burn-in test during fabrication and by isolating any laser device that has been found defective from among the laser devices mounted on the substrate.

It will also be noted that when using a plurality of LD arrays corresponding to the three RGB colors, the LD device defect rate is different for each color because the LD device material is different for each color. As a result, in order to improve the fabrication yield of the laser module or light source device, the defect rate for each color must be taken into account.

Accordingly, it is an object of the present invention to provide a laser module wherein any defective laser device can be isolated by performing a burn-in test on a plurality of laser devices mounted on a mounting substrate, and a method for fabricating such a laser module. It is another object of the present invention to provide a light source device that includes multiple laser device arrays, one for each of three colors, red, green, and blue, and that can be fabricated with a higher fabrication yield than would be the case if the configuration of the present invention were not employed.

Provided is a laser module including a plurality of laser devices that emit laser light, a driver IC for driving the plurality of laser devices, a mounting substrate on which the plurality of laser devices and the driver IC are mounted, a common electrode terminal to which a common electrode of the plurality of laser devices is connected, a plurality of individual electrode terminals to which individual electrodes of the plurality of laser devices are respectively connected, a plurality of driver terminals to which the driver IC is connected, and a plurality of test terminals which are respectively connected to the common electrode terminal and the plurality of individual electrode terminals, and to which an external power supply is to be connected when performing burn-in of the plurality of laser devices, wherein the number of the plurality of laser devices and the number of the plurality of test terminals are each larger than the number of the plurality of driver terminals.

Preferably, in the above laser module, the plurality of laser devices, the common electrode terminal, and the plurality of individual electrode terminals are arranged on an upper surface of the mounting substrate, and the plurality of test terminals are arranged on a bottom surface of the mounting substrate, and are respectively connected to the common electrode terminal and the plurality of individual electrode terminals via feed-through electrodes formed passing through the mounting substrate from the upper surface to the bottom surface.

Preferably, in the above laser module, the plurality of driver terminals are selectively connected via wire bonds to individual electrode terminals corresponding to non-defective laser devices selected from among the plurality of laser devices.

Preferably, in the above laser module, the plurality of laser devices are mounted face down on the mounting substrate, n-electrodes of the plurality of laser devices are connected to the common electrode terminal, and p-electrodes of the plurality of laser devices are respectively connected to the plurality of individual electrode terminals.

Provided is a laser module including a plurality of red laser devices that emit red laser light, a plurality of green laser devices that emit green laser light, a plurality of blue laser devices that emit blue laser light, a driver IC for driving the plurality of red laser devices, the plurality of green laser devices, and the plurality of blue laser devices, a mounting substrate on which the plurality of red laser devices, the plurality of green laser devices, the plurality of blue laser devices, and the driver IC are mounted, a common electrode terminal to which a common electrode of the plurality of red laser devices, the plurality of green laser devices, and the plurality of blue laser devices is connected, a plurality of individual electrode terminals to which individual electrodes of the plurality of red laser devices, the plurality of green laser devices, and the plurality of blue laser devices are respectively connected, a plurality of driver terminals to which the driver IC is connected, and a plurality of test terminals which are respectively connected to the common electrode terminal and the plurality of individual electrode terminals, and to which an external power supply is to be connected when performing burn-in of the plurality of red laser devices, the plurality of green laser devices, and the plurality of blue laser devices, wherein the number of the plurality of red laser devices, the number of the plurality of green laser devices, and the number of the plurality of blue laser devices and the number of the plurality of test terminals are each larger than the number of the plurality of driver terminals.

Preferably, the above laser module further includes a plurality of first optical fibers which are arranged on the mounting substrate, and through each of which laser light from a corresponding one of the plurality of laser devices is guided, a fiber connector connected to end portions of the plurality of first optical fibers, and a plurality of second optical fibers connected to respective ones of the plurality of first optical fibers via the fiber connector, wherein the number of the plurality of laser devices and the number of the plurality of first optical fibers are each larger than the number of the plurality of second optical fibers.

Provided is a light source device including the above laser module, wherein the plurality of laser devices are each a red laser device that emits red laser light, and the first and second optical fibers are respectively first and second red optical fibers through which the red laser light is guided, the above laser module, wherein the plurality of laser devices are each a green laser device that emits green laser light, and the first and second optical fibers are respectively first and second green optical fibers through which the green laser light is guided, the above laser module, wherein the plurality of laser devices are each a blue laser device that emits blue laser light, and the first and second optical fibers are respectively first and second blue optical fibers through which the blue laser light is guided, and a fiber bundle combiner which forms a fiber bundle by fixedly bundling together the plurality of second red optical fibers, the plurality of second green optical fibers, and the plurality of second blue optical fibers.

Provided is a light source device including a first laser module including a plurality of first laser devices for emitting red laser light, a plurality of first red optical fibers through each of which the red laser light from a corresponding one of the plurality of first laser devices is guided, a first fiber connector connected to the plurality of first red optical fibers, and a plurality of second red optical fibers respectively connected to some of the plurality of first red optical fibers via the first fiber connector, a second laser module including a plurality of second laser devices for emitting green laser light, a plurality of first green optical fibers through each of which the green laser light from a corresponding one of the plurality of second laser devices is guided, a second fiber connector connected to the plurality of first green optical fibers, and a plurality of second green optical fibers respectively connected to some of the plurality of first green optical fibers via the second fiber connector, a third laser module including a plurality of third laser devices for emitting blue laser light, a plurality of first blue optical fibers through each of which the blue laser light from a corresponding one of the plurality of third laser devices is guided, a third fiber connector connected to the plurality of first blue optical fibers, and a plurality of second blue optical fibers respectively connected to some of the plurality of first blue optical fibers via the third fiber connector, and a fiber bundle combiner which forms a fiber bundle by fixedly bundling together the plurality of second red optical fibers, the plurality of second green optical fibers, and the plurality of second blue optical fibers.

Preferably, in the above light source device, the number of the first laser devices and the number of the first red optical fibers are each larger than the number of the second red optical fibers, the number of the second laser devices and the number of the first green optical fibers are each larger than the number of the second green optical fibers, and the number of the third laser devices and the number of the first blue optical fibers are each larger than the number of the second blue optical fibers.

Preferably, in the above light source device, the amount of redundancy built into the number of the red laser devices and the number of the first red optical fibers with respect to the number of the second red optical fibers, the amount of redundancy built into the number of the green laser devices and the number of the first green optical fibers with respect to the number of the second green optical fibers, and the amount of redundancy built into the number of the blue laser devices and the number of the first blue optical fibers with respect to the number of the second blue optical fibers are different from each other.

Preferably, in the above light source device, the number of the second red optical fibers, the number of the second green optical fibers, and the number of the second blue optical fibers are the same.

Preferably, in the above light source device, the first and second red optical fibers, the first and second green optical fibers, and the first and second blue optical fibers are each a few-mode or single-mode optical fiber matched to a particular wavelength, and the first red optical fibers, the first green optical fibers, and the first blue optical fibers are each larger in diameter than the second red optical fibers, the second green optical fibers, and the second blue optical fibers, respectively.

Provided is a method for fabricating a laser module fabrication method including the steps of forming, on a mounting substrate, a common electrode terminal to which a common electrode of a plurality of laser devices that emit laser light is to be connected, a plurality of individual electrode terminals to which individual electrodes of the plurality of laser devices are to be respectively connected, a plurality of driver terminals to which a driver for driving the plurality of laser devices is to be connected, and a plurality of test terminals which are respectively connected to the common electrode terminal and the plurality of individual electrode terminals, mounting the plurality of laser devices and the driver IC on the mounting substrate, and connecting the plurality of test terminals to an external power supply and performing burn-in of the plurality of laser devices mounted on the mounting substrate, wherein the number of the plurality of laser devices and the number of the plurality of test terminals are each larger than the number of the plurality of driver terminals.

According to the above laser module, light source device, and laser module fabrication method, it is possible to isolate any defective laser device by performing a burn-in test on a plurality of laser devices mounted on a mounting substrate. Further, according to the above light source device, it is possible to provide a higher fabrication yield of a light source device that includes multiple laser device arrays, one for each of three colors, red, green, and blue than would be the case if the configuration of the present invention were not employed.

DESCRIPTION OF EMBODIMENTS

Hereinafter, with reference to the accompanying drawings, a laser module, a light source device, and a laser module fabrication method will be explained in detail. However, it should be noted that the present invention is not limited to the drawings or the embodiments described below.

The laser module is a laser light source applicable for use in a volumetric display such as a near-to-eye display or a direct-view light field display or the like. In this laser module, burn-in electrodes and interconnections are formed in advance on a mounting substrate, and a plurality of laser devices designed with redundancy by accounting for the production yield are mounted on the mounting substrate. Then, a burn-in test is performed during the fabrication of the laser module to sort the mounted laser devices into defectives and non-defectives, and only the non-defective laser devices are connected to a driver IC on the mounting substrate. In this way, this laser module makes it possible to perform the burn-in during the fabrication to isolate any defective laser device, with the purpose of improving the fabrication yield of the laser module.

Figure 1:
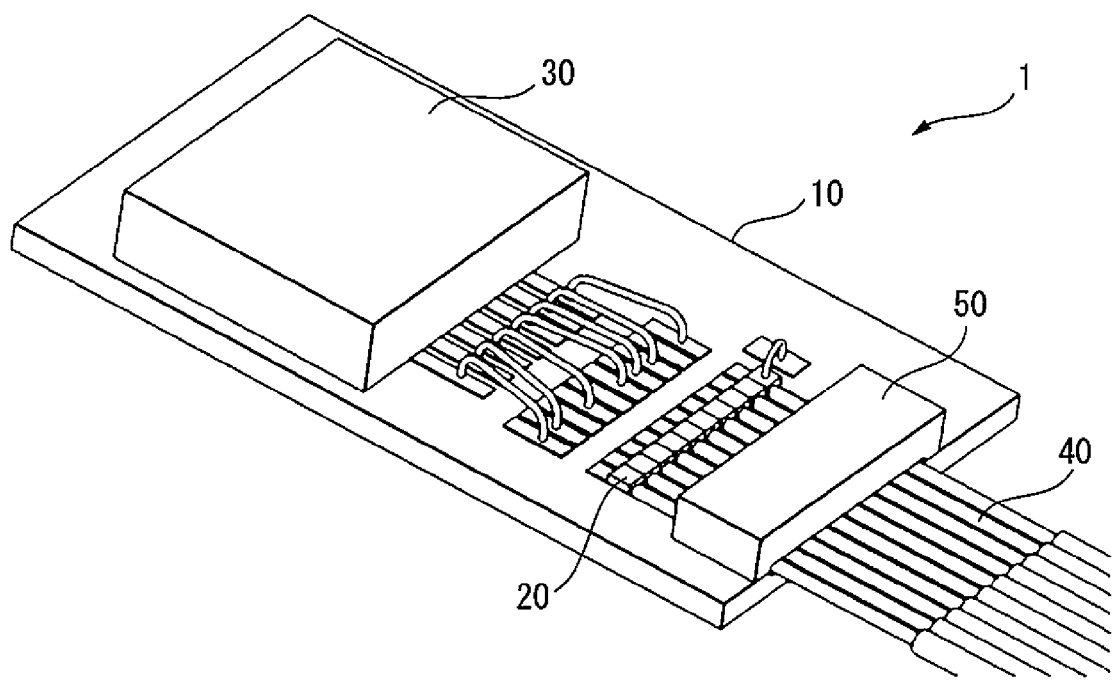
FIG. 1 is a perspective view of a laser module 1.
Figure 2A:
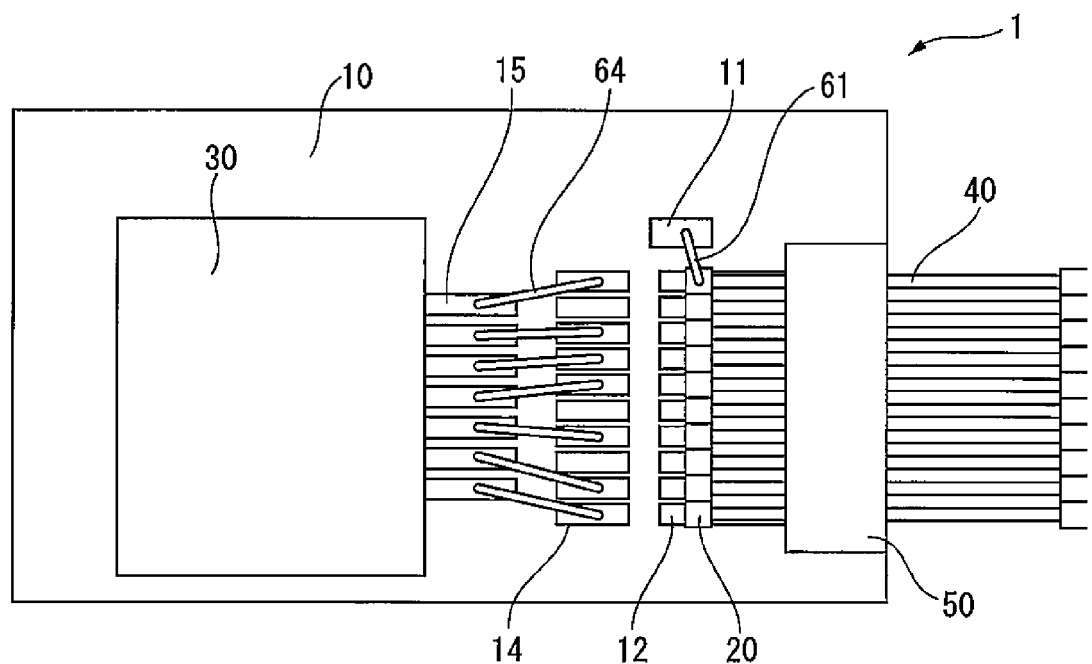
FIGS. 2A and 2B are a top plan view and a side view, respectively, of the laser module 1.
Figure 2B:
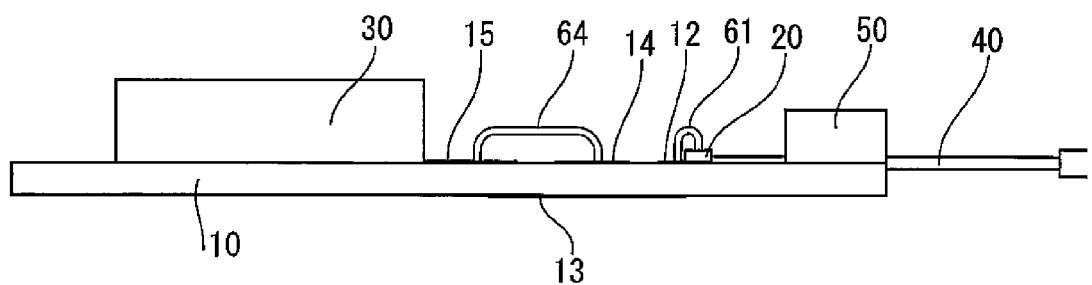
Figure 3:
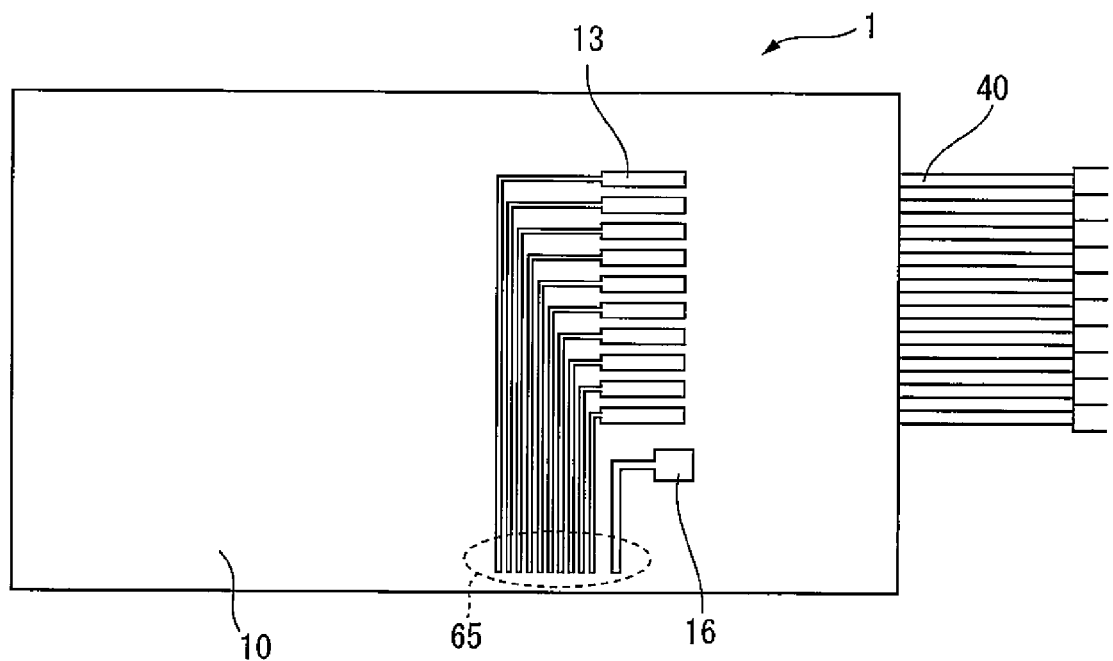
FIG. 3 is a bottom view of the laser module 1.

FIG. 1 is a perspective view of a laser module 1. FIGS. 2A and 2B are a top plan view and a side view, respectively, of the laser module 1. FIG. 3 is a bottom view of the laser module 1.

The laser module 1 includes, as major component elements, a silicon substrate 10, an LD array 20, a driver IC 30, a fiber array 40, and a sub-substrate 50, etc. The laser module 1 is an integrated laser module constructed by mounting the LD array 20, driver IC 30, fiber array 40, sub-substrate 50, etc., on the upper surface of the silicon substrate 10 which is also called a Si platform.

The silicon substrate 10 is one example of the mounting substrate, and has a size of a dozen or so millimeters square. The silicon substrate 10 is formed with through-silicon vias (TSVs) passing through the substrate from the top to the bottom thereof. The silicon substrate 10 is mounted on a circuit substrate (not shown) that supplies electrical signals to the LD array 20, driver IC 30, etc., and the electrical signals are supplied from the circuit substrate to various devices such as the LD array 20, driver IC 30, etc., through the TSVs.

The LD array 20 is, for example, a laser bar containing a plurality of LD devices, which is one example of the laser devices. In the illustrated example, the LD array 20 is constructed from ten LD devices arranged in a single line. Each LD device is, for example, about 250 µm square in size, and the ten LD devices together have a length of about several millimeters.

The array used in the laser module 1 is constructed using a redundant number of LD devices by accounting for the production yield of LD devices. For example, suppose that the production yield of LD devices is around 70%, and that the laser module 1 requires the use of seven LD devices; then, a total of ten LD devices are mounted in advance on the silicon substrate 10 so that at least seven non-defective devices are left after defective devices are eliminated by burn-in.

The LD array 20 is mounted on the upper surface of the silicon substrate 10 by surface activated bonding after the driver IC 30 has been mounted by soldering or like means. Further, to improve the heat-sinking property and to accurately position the LD devices with the surface of the silicon substrate 10 as the datum surface, each of the LD devices constituting the LD array 20 is mounted face down so that its active layer faces the silicon substrate 10. As a result, n- and p-electrodes of each LD device are located, the former on the side farther away from the silicon substrate 10 and the latter on the side nearer to it. The n-electrode is a common electrode shared by all the LD devices, while the p-electrode is an individual electrode specific to each individual LD device.

The driver IC 30 is an electronic component for driving the LD array 20 and includes at least the function of controlling the supply of current to the LD array 20. The driver IC 30 preferably includes a digital interface, and more preferably includes a core unit such as a CPU and memory as a control unit. The driver IC 30 has a size measuring, for example, about several millimeters square, and is mounted on the upper surface of the silicon substrate 10 by soldering.

The fiber array 40 includes a plurality of optical fibers, one for each of the LD devices in the LD array 20. Each fiber in the fiber array 40 is, for example, a single-mode fiber (SMF) through which laser light emitted from the LD array 20 is guided. A GI (Graded Index) lens as a coupling member may be provided integrally on the end face of the fiber array 40. Alternatively, instead of providing the fiber array 40, flat plate-like optical waveguides may be formed, for example, on the silicon substrate 10 to guide the laser light from the LD array 20.

The sub-substrate 50 is, for example, an inverted U-shaped substrate the lower surface of which is formed with grooves for holding the fiber array 40. The sub-substrate 50 is bonded to the upper surface of the silicon substrate 10, and fixedly holds the end portion of the fiber array 40. A silicon substrate or glass substrate is used as the sub-substrate 50. With the sub-substrate 50 bonded to the silicon substrate 10, the end of each fiber in the fiber array 40 is optically coupled to a corresponding one of the LD devices in the LD array 20. A lens unit constructed by fusing together a GI lens for enhancing the efficiency of coupling to the LD device and the single-mode fiber in the fiber array 40 may be fixed in advance to the sub-substrate 50.

Figure 4:
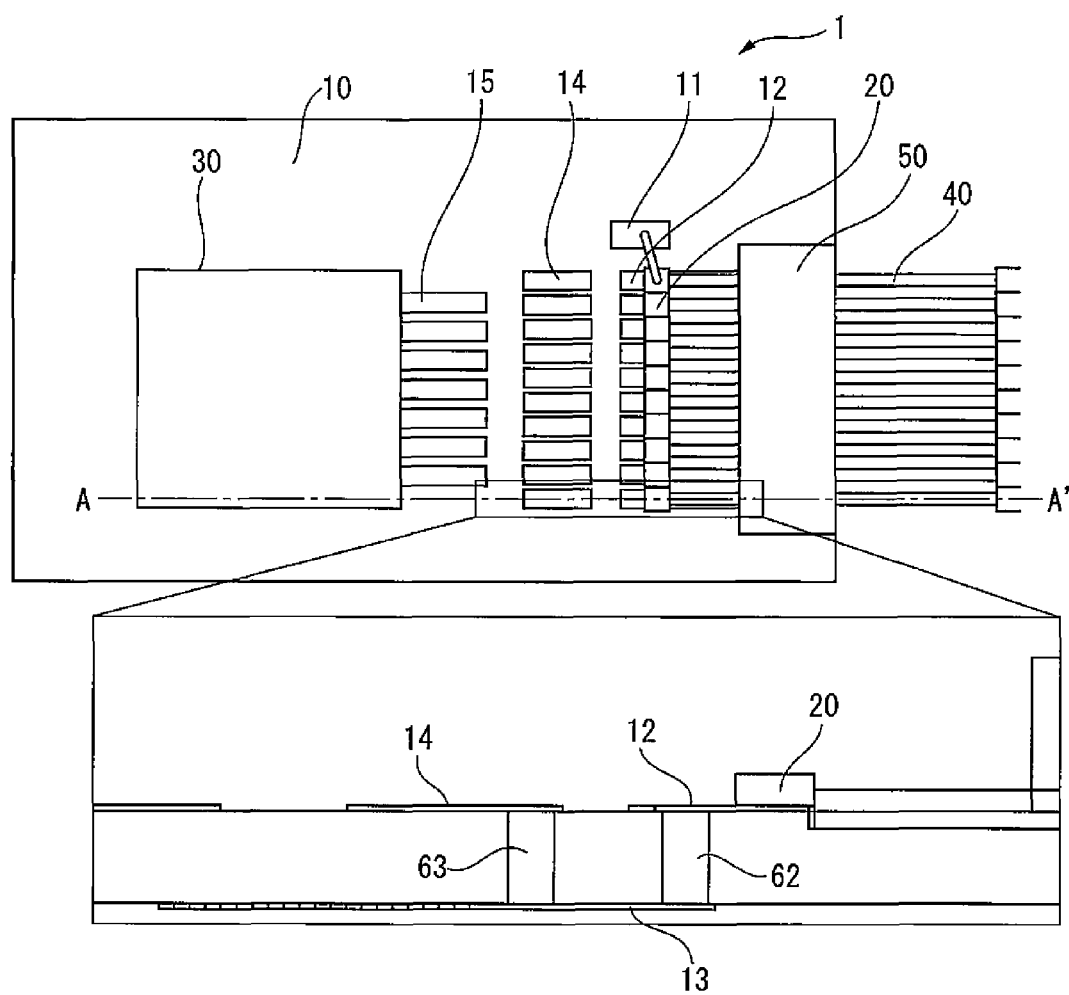
FIG. 4 is a diagram, partly in cross section, of the laser module 1.
Figure 5:
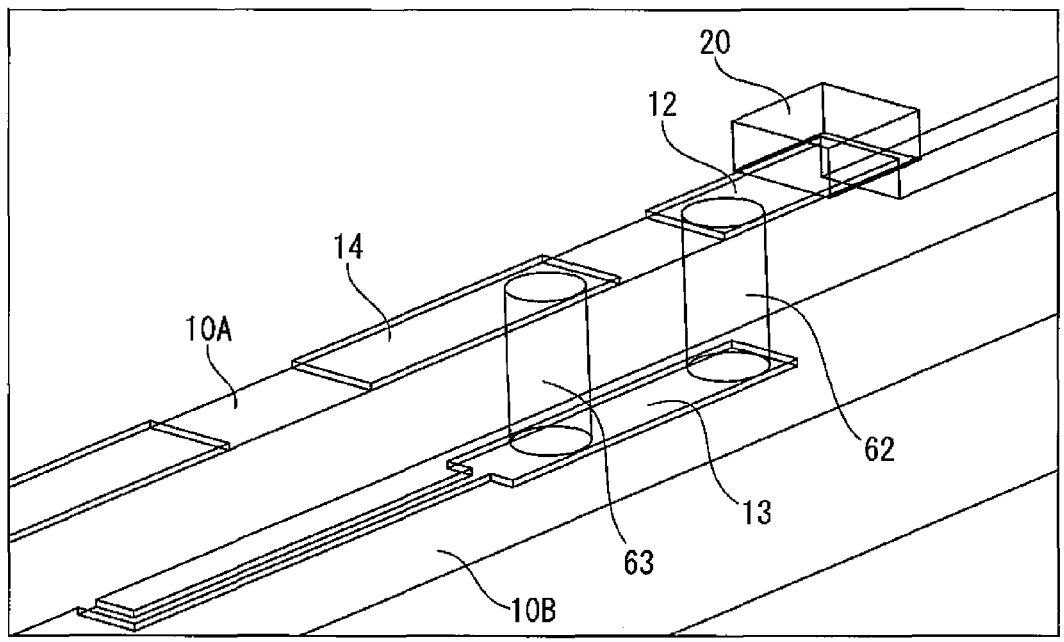
FIG. 5 is a diagram, partly in perspective, illustrating schematically the internal structure of the laser module 1.

FIG. 4 is a diagram, partly in cross section, of the laser module 1. FIG. 5 is a diagram, partly in perspective, illustrating schematically the internal structure of the laser module 1. In FIG. 5, reference characters 10A and 10B respectively indicate the upper surface and the bottom surface of the silicon substrate 10.

The silicon substrate 10 is formed in advance with electrode structures for electrically connecting the devices in order for the laser module 1 to operate and electrode structures used to perform the burn-in of the LD array 20 by supplying external power. As shown in FIGS. 2A to 5, the electrode structures formed on the silicon substrate 10 include an LD common electrode pad 11, an array of LD individual electrode pads 12, an array of test p-electrode pads 13, an array of LD connection pads 14, an array of driver electrode pads 15, and a test n-electrode pad 16. These electrode pads are interconnected by wire bonds 61 and 64 and feed-through electrodes 62 and 63.

The LD common electrode pad 11 is one example of the common electrode terminal, and is formed on the upper surface of the silicon substrate 10. The n-electrode as the common electrode of the LD array 20 is connected to the LD common electrode pad 11 by the wire bond 61.

The LD individual electrode pads 12 are one example of the individual electrode terminals, and are formed on the upper surface of the silicon substrate 10. The array of LD individual electrode pads 12 includes ten electrode pads which are arranged in a stripe pattern to correspond one for one with the ten LD devices in the LD array 20. Each LD individual electrode pad 12 is connected to the individual electrode, i.e., the p-electrode, of a corresponding one of the LD devices.

By thus forming the LD individual electrode pads 12 in a stripe pattern, it becomes possible to supply current to each individual LD device even when the LD array 20 is mounted as a laser bar. However, when the LD devices are mounted as individually separated devices, the LD individual electrode pads 12 need not be arranged in a stripe pattern.

The test p-electrode pads 13 and the test n-electrode pad 16 are one example of the test terminals used for burn-in, and are formed on the bottom surface of the silicon substrate 10. The array of test p-electrode pads 13 includes ten electrode pads formed so as to correspond one for one with the LD individual electrode pads 12. As shown in FIGS. 4 and 5, each test p-electrode pad 13 is connected to the corresponding LD individual electrode pad 12 via the feed-through electrode 62 formed passing through the silicon substrate 10 from the top to the bottom thereof. That is, the p-electrode of each LD device in the LD array 20 is brought out to the bottom side of the silicon substrate 10 and connected to the corresponding test p-electrode pad 13.

On the other hand, the test n-electrode pad 16 includes a single electrode pad common to all the LD devices. The test n-electrode pad 16 is connected to the LD common electrode pad 11 via a feed-through electrode not shown. That is, the n-electrode of each LD device is brought out to the bottom side of the silicon substrate 10 and connected to the test n-electrode pad 16.

By connecting an external power supply to the lead portions 65 of the test p-electrode pads 13 and test n-electrode pad 16, and by supplying current to each individual LD device, the burn-in test can be conducted with the LD array 20 mounted on the silicon substrate 10.

The LD connection pads 14 are terminals for connecting the LD array 20 to the driver IC 30, and are formed on the upper surface of the silicon substrate 10 so as to the adjacent to the LD individual electrode pads 12. The array of LD connection pads 14 includes ten electrode pads which correspond one for one with the LD individual electrode pads 12. As shown in FIGS. 4 and 5, each LD connection pad 14 is connected to the corresponding test p-electrode pad 13 via the feed-through electrode 63 formed passing through the silicon substrate 10 from the top to the bottom thereof. Accordingly, the p-electrode of each LD device in the LD array 20 is connected to the corresponding LD connection pad 14 via the LD individual electrode pad 12, feed-through electrode 62, test p-electrode pad 13, and feed-through electrode 63.

The driver electrode pads 15 are one example of the driver terminals, and are formed on the upper surface of the silicon substrate 10. In the laser module 1, since the LD devices are redundant in number by accounting for the production yield, as earlier described, the number of driver electrode pads 15 is smaller than the number of LD devices constituting the LD array 20. Therefore, in the illustrated example, only seven driver electrode pads 15 are formed, as opposed to the ten LD devices. The driver electrode pads 15 are selectively connected via corresponding wire bonds 64 to the LD connection pads 14 corresponding to the LD devices sorted as non-defective in the burn-in test.

Figure 6:
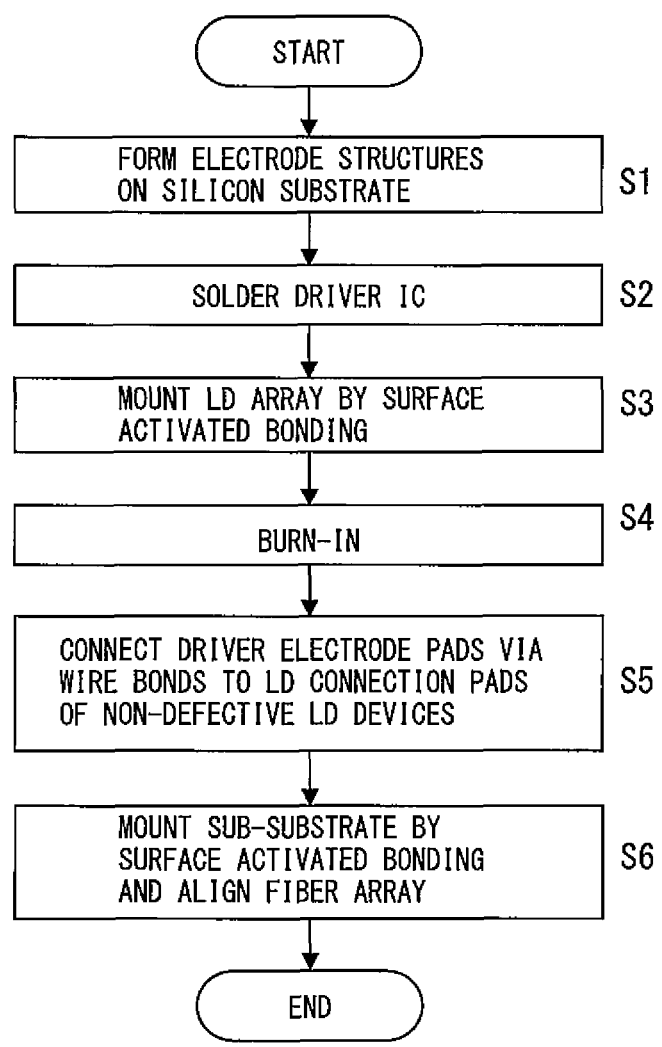
FIG. 6 is a flowchart illustrating an example of a fabrication process for the laser module 1.

FIG. 6 is a flowchart illustrating an example of a fabrication process for the laser module 1.

First, the above-described electrode structures are formed on the silicon substrate 10 (step S1). More specifically, the LD common electrode pad 11, the LD individual electrode pads 12, the LD connection pads 14, and the driver electrode pads 15 are formed on the upper surface of the silicon substrate 10, and the test p-electrode pads 13 and the test n-electrode pad 16 are formed on the bottom surface of the silicon substrate 10; further, the feed-through electrodes 62, 63, etc., for electrically connecting the electrodes on the upper surface to the electrodes on the bottom surface are formed passing through the silicon substrate 10.

Next, the driver IC 30 is soldered to the silicon substrate 10 (step S2), and after that, the LD array 20 is bonded to the upper surface of the silicon substrate 10 by passive alignment and surface activation (step S3). In this step, the position of the LD array 20 relative to the silicon substrate 10 is determined by registering, for example, the alignment marks provided on the LD array 20 with the alignment marks provided on the silicon substrate 10. By thus performing the surface activated bonding after the soldering is done, the LD array 20 can be mounted without subjecting the LD devices in the LD array 20 to the soldering heat.

In this condition, the burn-in of the LD array 20 is performed, and the LD devices are sorted into defectives and non-defectives (step S4). In this step, the test p-electrode pad 13 and the test n-electrode pad 16 are connected to the external power supply by using clip connectors or the like, and current is supplied to each individual LD device in the LD array 20 under the control of a test driver external to the laser module 1. When the burn-in test is completed, the test p-electrode pad 13 and the test n-electrode pad 16 are disconnected from the external power supply.

Next, the driver electrode pads 15 are connected via wire bonds 64 to the LD connection pads 14 corresponding to the LD devices sorted as non-defective in step S4 (step S5). Here, the LD devices sorted as defective in step S4 may be cut and removed from the LD array 20 by laser cutting or other means.

Further, the fiber array 40 is fixed to the sub-substrate 50, and the two members are bonded to the silicon substrate 10 by active alignment and surface activation (step S6). In this step, the LD array 20 is caused to emit laser light while changing the position of the sub-substrate 50 relative to the silicon substrate 10 and, based on the intensity of the light being emitted through the fiber array 40, the active alignment is performed to determine the position of the sub-substrate 50 relative to the silicon substrate 10. In this way, the single-mode fibers in the fiber array 40 are connected to the LD devices sorted as non-defective in step S4. Then, the fabrication process of the laser module 1 is terminated.

Figure 7:
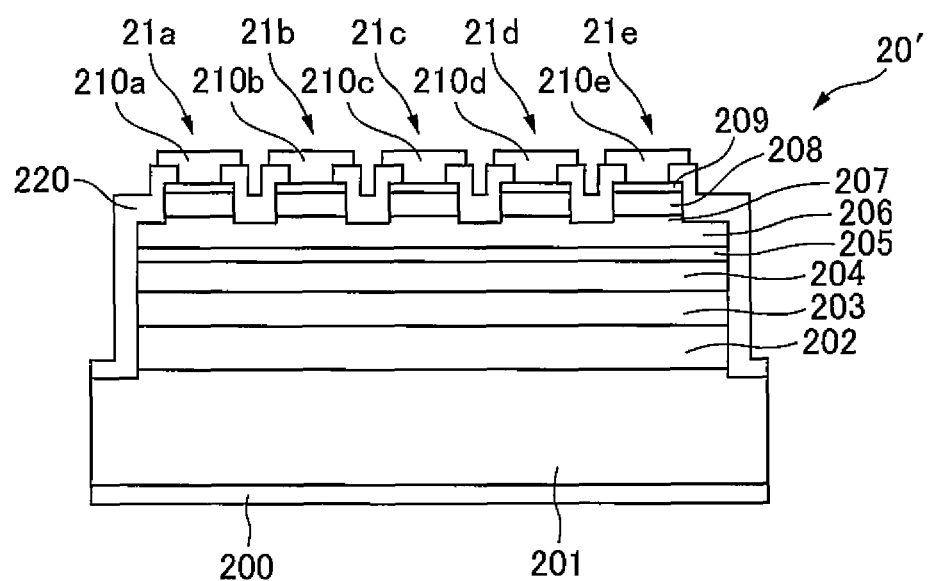
FIG. 7 is a cross-sectional view of an LD array 20'.

FIG. 7 is a cross-sectional view of an LD array 20'. While the LD array 20 constructed from a plurality of individually separated LD devices has been shown in FIGS. 1, 2A, and 4, the LD array 20' formed from a single semiconductor crystal from which a plurality of wire leads are drawn out, as shown in FIG. 7, may be used in the laser module 1. As an example, the LD array shown in FIG. 7 contains five LD devices (laser devices).

The LD array 20' is formed using, for example, a GaN-based compound semiconductor represented by the chemical formula $Al_X In_Y Ga_{1-X-Y} N$ ($0 \leq X \leq 1$, $0 \leq Y \leq 1$, $0 \leq X+Y \leq 1$). As shown in FIG. 7, the LD array 20' is constructed by forming, for example, an n-type substrate 201, an nGaN contact layer 202, an nAlGaN clad layer 203, an nInGaN guide layer 204, an active layer 205, a pInGaN guide layer 206, a pAlGaN electron blocking layer 207, a pAlGaN clad layer 208, and a p-type contact layer 209, one on top of another in the order listed.

Further, as shown in FIG. 7, the LD array 20' includes ridge portions 21a to 21e formed on the top. In the LD array 20', p-electrodes 210a to 210e are formed on the ridge portions 21a to 21e, respectively, and an n-electrode 200 is formed on the bottom surface of the n-type substrate 201. Further, insulating films 220 are formed on the side faces of the respective ridge portions 21a to 21e. The ridge portions 21a to 21e are current-driven independently of one another by using the n-electrode 200 as the common electrode and the p-electrodes 210a to 210e as the individual laser electrodes, and thus operate as respectively independent laser devices.

Figure 8:
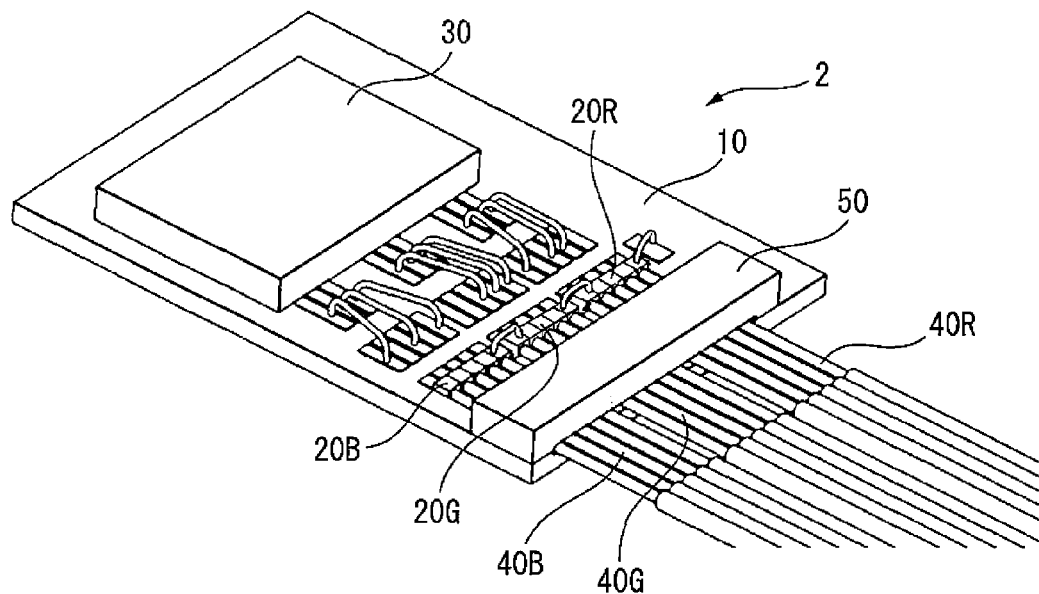
FIG. 8 is a perspective view of a laser module 2.
Figure 9:
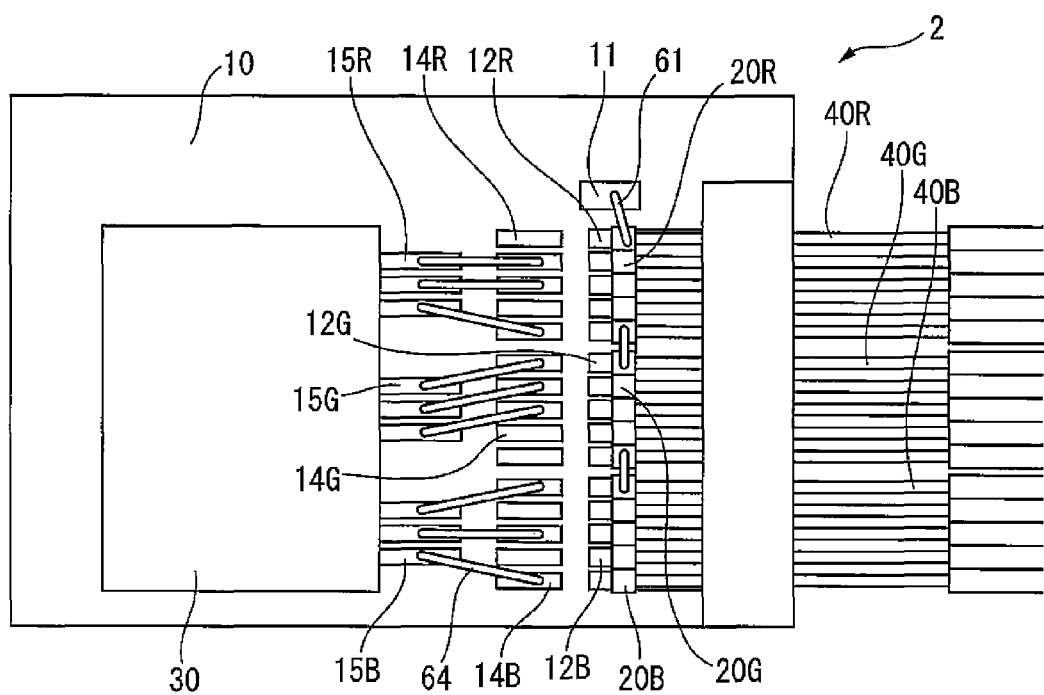
FIG. 9 is a top plan view of the laser module 2.

FIG. 8 is a perspective view of a laser module 2. FIG. 9 is a top plan view of the laser module 2.

The laser module 2 includes, as major component elements, a silicon substrate 10, LD arrays 20R, 20G, and 20B, a driver IC 30, fiber arrays 40R, 40G, and 40B, and a sub-substrate 50. While the laser module 1 is a laser light source that emits monochromatic laser light, the laser module 2 is a laser light source that emits laser light of red (R), green (G), and blue (B) colors. Otherwise, the laser module 2 has the same structure as that of the laser module 1; therefore, the following describes the laser module 2 by focusing on differences from the laser module 1, and descriptions already given will not be repeated here.

The LD arrays 20R, 20G, and 20B are each a laser bar containing five LD devices that emit laser light of red, green, or blue, respectively. In the laser module 2 also, each array is constructed using a redundant number of LD devices by accounting for the production yield of LD devices. In FIGS. 8 and 9, the LD arrays 20R, 20G, and 20B are shown as having equal numbers of LD devices, but the amount of redundancy to be incorporated may be varied among the three LD arrays by considering the defect rate which differs depending on such factors as the materials, compositions, and structures of the LD devices of different colors.

The fiber arrays 40R, 40G, and 40B are arrays of single-mode fibers corresponding one for one with the LD devices in the respective LD arrays 20R, 20G, and 20B.

In the laser module 2, electrode structures similar to those of the laser module 1 are also formed. The n-electrodes of the LD devices in the LD arrays 20R, 20G, and 20B are connected in common by three wire bonds 61 to the LD common electrode pad 11. On the other hand, in the laser module 2, arrays of LD individual electrode pads 12R, 12G, and 12G, an array of test p-electrode pads (not shown), and arrays of LD connection pads 14R, 14G, and 14B each include five pads to correspond with the number of LD devices contained in the respective LD arrays 20R, 20G, and 20B. The number of pads may be varied depending on the amount of redundancy incorporated into the respective LD arrays.

In the laser module 2, arrays of driver electrode pads 15R, 15G, and 15B each include three electrode pads which are smaller in number than the five LD devices contained in each of the three LD arrays. Therefore, the driver electrode pads 15R, 15G, and 15B are selectively connected via wire bonds 64 to the respective LD connection pads 14R, 14G, and 14B that correspond to the LD devices contained in the respective LD arrays 20R, 20G, and 20B and sorted as non-defective by burn-in.

In the laser module 2 also, with the above electrode structures it becomes possible to perform burn-in with the LD arrays 20R, 20G, and 20B mounted on the silicon substrate 10 by connecting an external power supply to the test p-electrode pad and test n-electrode pad not shown and by supplying current to each individual LD device.

Further, in the laser module 2 shown in FIGS. 8 and 9, the LD array 20' of the so-called one-piece structure shown in FIG. 7 may be used as each of the LD arrays 20R, 20G, and 20B.

As has been described above, in the laser modules 1 and 2, the burn-in electrodes and interconnections redundant in number to correspond with the number of LD devices to be mounted are formed in advance on the silicon substrate 10. Then, in the laser modules 1 and 2, burn-in is performed during the fabrication, and only the LD devices confirmed to be non-defective from among the redundantly mounted LD devices are connected to the driver IC 30. In this way, in the laser modules 1 and 2, the fabrication yield can be enhanced by sorting out any defective devices from among the mounted LD devices and by isolating such defective devices. Furthermore, in the laser modules 1 and 2, since the number of components as well as the number of fabrication steps can be reduced, not only can the fabrication yield be enhanced, but the fabrication cost can also be reduced at the same time.

Figure 10:
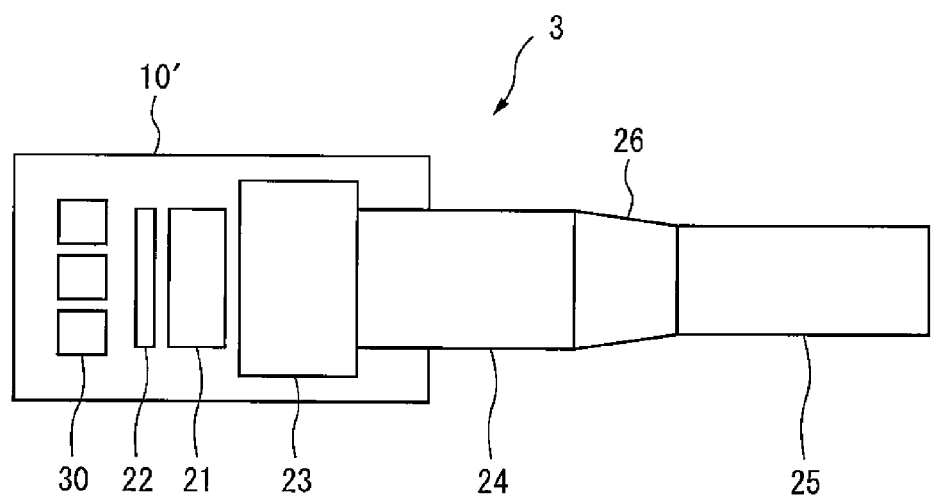
FIG. 10 is a schematic diagram of a laser module 3.
Figure 11:
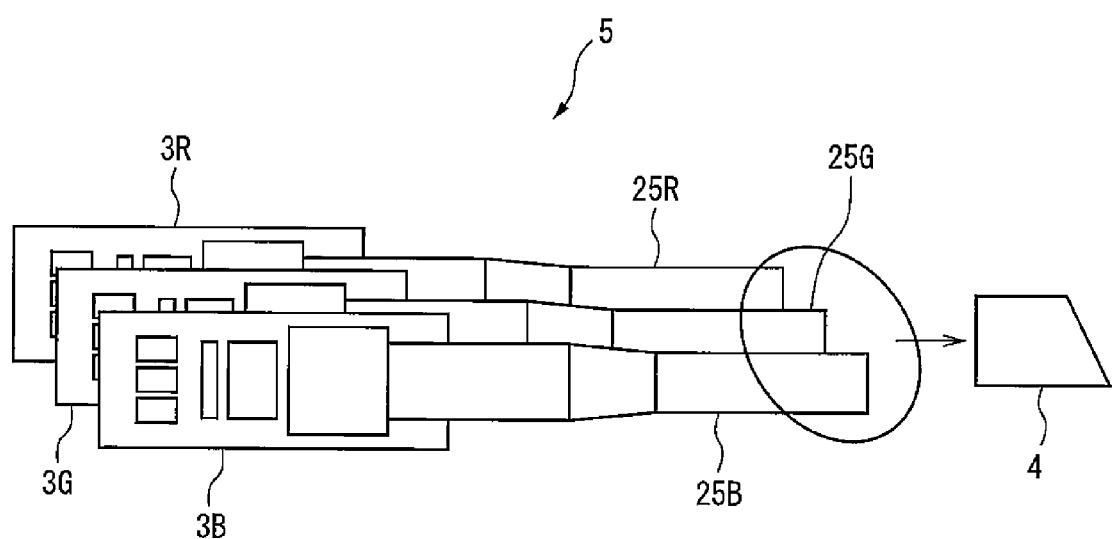
FIG. 11 is a schematic diagram of a light source device 5 constructed by using laser modules 3 of FIG. 10, one for each of three colors of RGB.

FIG. 10 is a schematic diagram of a laser module 3. FIG. 11 is a schematic diagram of a light source device 5 constructed by using laser modules 3 of FIG. 10, one for each of three colors of RGB.

The light source device 5 shown in FIG. 11 includes a laser module 3R, a laser module 3G, a laser module 3B, and a fiber bundle combiner 4.

The light source device 5 uses the three laser modules, one for each color, as RGB light sources. The laser module 3R is one example of the first laser module, and emits red laser light through a fiber array 25R. The laser module 3G is one example of the second laser module, and emits green laser light through a fiber array 25G. The laser module 3B is one example of the third laser module, and emits blue laser light through a fiber array 25B. The laser modules 3R, 3G, and 3B are each identical in structure to the laser module 3 of FIG. 10, and only differ in the wavelength of laser light emission.

The fiber bundle combiner 4 is constructed, for example, from silica glass, and forms a fiber bundle by fixedly bundling together the fiber arrays 25R, 25G, and 25B extending from the respective modules. More specifically, the fiber bundle combiner 4 forms the fiber bundle by fixing the ends of the respective fibers in such a manner that a plurality of sets of three optical fibers, one from each of the fiber arrays 25R, 25G, and 25B, are stacked in layers. In this way, in the light source device 5, the RGB optical fibers from the respective laser modules 3 are bundled together by the fiber bundle combiner 4, rather than bundling them together after combining the RGB lights.

The fiber arrays 25R, 25G, and 25B are each comprised of, for example, ten optical fibers, and in the light source device 5, ten optical fiber sets each including three RGB optical fibers are stacked in layers and arrayed together. For example, when using the light source device 5 as a light source for a volumetric display, the respective optical fiber sets emit laser lights to be focused at different depth positions corresponding to the ten layers.

The laser module 3 shown in FIG. 10 includes a silicon substrate 10', an LD array 21, a PD (photodiode) array 22, a sub-substrate 23, a first fiber array 24, a second fiber array 25, a fiber connector 26, and a driver IC 30. The LD array 21, PD array 22, sub-substrate 23, first fiber array 24, and driver IC 30 are mounted on the silicon substrate 10'.

The silicon substrate 10' is, for example, a TSV substrate which is formed with through-silicon vias (TSVs) passing through the substrate from the top to the bottom thereof, and which is electrically connected to a circuit substrate, not shown, via solder bumps provided in a clustered manner on the bottom surface. Alternatively, the silicon substrate 10' may be an FPC (Flexible Printed Circuit) substrate. Though not shown in FIG. 10, the LD common electrode pad 11, LD individual electrode pads 12, test p-electrode pads 13, LD connection pads 14, driver electrode pads 15, test n-electrode pad 16, wire bonds 61 and 64, and feed-through electrodes 62 and 63, similar to those provided on the silicon substrate 10 of the laser module 1, are also provided on the silicon substrate 10' of the laser module 3.

The LD array 21 is constructed from a plurality of direct lasers that emit light of the same color, red, green, or blue. The LD array 21 in the laser module 3R shown in FIG. 10 is one example of the plurality of red laser devices (first laser devices) all of which emit red laser light. The LD array 21 in the laser module 3G is one example of the plurality of green laser devices (second laser devices) all of which emit green laser light. The LD array 21 in the laser module 3B is one example of the plurality of blue laser devices (third laser devices) all of which emit blue laser light. The LD array 21 is driven by a current supplied from the driver IC 30.

The LD array 21 is mounted on the silicon substrate 10' by surface activated bonding via micro bumps provided on the upper surface of the silicon substrate 10'. The surface activated bonding is a technique that activates material surfaces by removing inactive layers such as oxides, dirt (contaminants), etc., covering the material surfaces by Ar (argon) plasma or other processing, and that bonds the surfaces together at normal temperatures by causing atoms having high surface energy to contact each other and by utilizing the adhesion forces acting between the atoms under a high load.

Alternatively, the LD array 21 may be constructed from laser devices that emit light in the infrared region of the spectrum, and a PPLN (Periodically Poled Lithium Niobate) array (not shown) may be provided so as to be optically coupled to the respective laser devices; then, the light generated by each LD device may be wavelength-converted into the laser light of the corresponding color for output. The term "optically coupled" means that the optical devices are positioned relative to each other so that the light emitted from one optical device can be directly input into the other optical device.

A production batch of LD devices generally contains a certain percentage of defectives, as earlier described, but when constructing the LD array 21 from bare chips, it is not possible to verify its operation until after all the devices have been mounted. In view of this, a certain amount of redundancy is provided by constructing the LD array 21 using a larger number of LD devices than required so that any defectives can be eliminated after burn-in (aging under electrical stresses).

Unlike laser modules for optical communications, laser modules for laser displays emit light over a wide wavelength range (RGB). As a result, the material, composition, and structure must be made different for each of the RGB lasers, and the wafer size is also different. Therefore, in the light source device 5, the number of devices must be determined for each of the laser modules 3R, 3G, and 3B by considering the differences in the production yield for each color, because the LD device defect rate is different for each color. If, for example, ten non-defective devices are to be obtained consistently for the LD array 21 in each laser module, the number of devices used to construct the LD array has to be changed for each laser module (i.e., for each color). Therefore, in the light source device 5, the number of devices used to construct the LD array 21 is changed for each color, for example, 17 for the laser module 3R (red laser), 15 for the laser module 3G (green laser), and 16 for the laser module 3B (blue laser).

For example, if the number of devices constituting the LD array 21 is 15, then even if a maximum of five devices are rendered defective in the burn-in process, the whole laser module is prevented from being rendered defective. By thus incorporating redundancy into the design of the LD array 21 in each laser module, the fabrication yields of the respective laser modules 3R, 3G, and 3B are improved.

The PD array 22 is constructed from a plurality of photodiodes that are arranged so as to correspond one for one with the respective LD devices in the LD array 21 and that are disposed on the upstream side of the respective LD devices as viewed along the direction of laser light emission. Each photodiode in the PD array 22 receives backward light from the corresponding LD device and monitors the amount of light from it. The PD array 22 is mounted on the silicon substrate 10' by surface activated bonding in the same manner as the LD array 21.

Since the current vs. light output characteristics of each LD device change with age, it is preferable to monitor the amount of light and perform feedback control in order to maintain the output at a constant level. Therefore, in the laser module 3, the PD array 22 monitors the amount of light from each LD device, and the driver IC 30 controls the drive current to the LD device in accordance with the detected amount of light so as to maintain the amount of light at a constant level.

The sub-substrate 23 is, for example, an inverted U-shaped substrate the lower surface of which is formed with grooves for holding the first fiber array 24. The sub-substrate 23 is bonded to the silicon substrate 10', and fixedly holds the end portion of the first fiber array 24. A silicon substrate or glass substrate is used as the sub-substrate 23. The sub-substrate 23 is mounted on the silicon substrate 10' by surface activated bonding in the same manner as the LD array 21. A GI (Graded Index) lens as a coupling member may be provided integrally with the end portion of the sub-substrate 23. Further, the sub-substrate 23 may be constructed from a V-grooved substrate instead of an inverted U-shaped substrate.

Each fiber in the first fiber array 24 is a few-mode or single-mode optical fiber that is matched to the wavelength used and through which the laser light emitted from the LD array 21 is guided. With the sub-substrate 23 bonded to the silicon substrate 10', the end portion of the first fiber array 24 is optically coupled to the LD devices in the LD array 21. The number of fibers constituting the first fiber array 24 is the same as the number of devices constituting the LD array 21. For example, in the laser modules 3R, 3G, and 3B, since the number of devices constituting the LD array 21 is 17, 15, and 16, respectively, the number of fibers constituting the first fiber array 24 is also 17, 15, and 16, respectively. Further, to facilitate the alignment with the respective devices in the LD array 21, it is desirable from the standpoint of mode propagation and coupling efficiency to use for the first fiber array 24 the same fibers as those used for the second fiber array 25, but in order to increase the alignment tolerance for fabrication, fibers with a diameter, for example, a 6-µm diameter, that is larger than the diameter of the fibers used for the second fiber array 25 may be used. In this case also, the final beam quality does not degrade, though the propagation mode suffers coupling loss after all, due to the effect of the mode filtering determined by the second fiber array 25.

Each fiber in the second fiber array 25 has one end optically coupled to the first fiber array 24 via the fiber connector 26. Each fiber in the second fiber array 25 is a few-mode or single-mode optical fiber that is matched to the wavelength used and through which the laser light emitted from the LD array 21 is guided to the outside of the laser module 3. The second fiber arrays 25 in the laser modules 3R, 3G, and 3B correspond respectively to the fiber arrays 25R, 25G, and 25B shown in FIG. 11. The second fiber array 25 in each of the laser modules 3R, 3G, and 3B is fixed by the fiber bundle combiner 4 at the end opposite to the end connected to the fiber connector 26, and emits laser light of the corresponding color from that opposite end.

The number of fibers in the second fiber array 25 is determined based on the number of sets of RGB laser lights required to accomplish the purpose of the light source device 5. Unlike the first fiber array 24, the number of fibers constituting the second fiber array 25 is the same (for example, 10) for all of the laser modules 3R, 3G, and 3B. However, the number of fibers constituting the second fiber array may be changed for each of the RGB laser modules by considering such factors as the differences in the light intensity of each of the RGB colors.

Since the first fiber array 24 is constructed using a redundant number of fibers to match the number of devices in the LD array 21, the number of fibers constituting the second fiber array 25 is smaller than the number of fibers constituting the first fiber array 24. Accordingly, the fibers in the second fiber array 25 are connected to the selected fibers in the first fiber array 24 via the fiber connector 26. The fibers to which the fibers in the second fiber array 25 are to be connected are selected so that the fibers are connected only to the non-defective LD devices after eliminating defectives from the LD array 21 by burn-in in the fabrication process of the laser module 3.

Further, fibers with a diameter, for example, a 4-µm diameter, that is smaller than the diameter of the fibers used for the first fiber array 24 are used for the second fiber array 25. By converting the mode field diameter, fibers with a larger diameter (for example, 6 µm) are used for the first fiber array 24 located nearer to the LD array 21 in order to facilitate the alignment. For example, when using a one-to-one projection system in an applications such as a near-to-eye display, fibers with a diameter (for example, 4 µm) that matches the size of the photoreceptor cell in the retina of the human eye are used for the second fiber array 25 located nearer to the eyeball so that an image free from blurring can be displayed.

The fiber connector 26 is a connecting for connecting the first fiber array 24 to the second fiber array 25. A commercially available connector of a conventional type may be used as the fiber connector 26.

The driver IC 30 is mounted on the upper surface of the silicon substrate 10' by soldering. The driver IC 30 is an electronic component for driving the LD array 21, etc., and includes at least the function of controlling the supply of current required to drive the LD array 21. The driver IC 30 preferably includes a digital interface, and more preferably includes a core unit such as a CPU and memory as a control unit.

Figure 12:
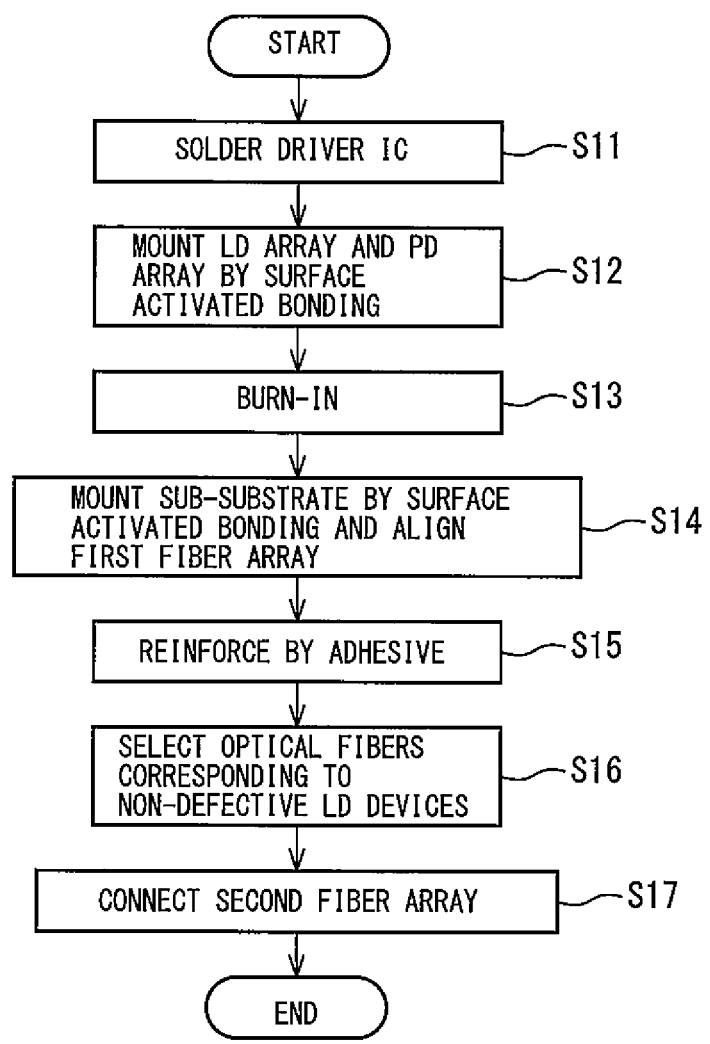
FIG. 12 is a flowchart illustrating an example of a fabrication process for the laser module 3.

FIG. 12 is a flowchart illustrating an example of a fabrication process for the laser module 3. Before fabricating the laser module 3, the electrode structures previously described with reference to FIGS. 1 to 5 are formed in advance on the silicon substrate 10'.

In the fabrication of the laser module 3, first the driver IC 30 is soldered to the silicon substrate 10' (step S11). After that, the LD array 21 and PD array 22 are bonded to the silicon substrate 10' by passive alignment and surface activation (step S12). In step S12, the positions of the LD array 21 and PD array 22 relative to the silicon substrate 10' are determined by registering, for example, the alignment marks provided on the LD array 21 and PD array 22 with the alignment marks provided on the silicon substrate 10'. By thus performing the surface activated bonding after the soldering is done, the optical devices can be mounted without subjecting the optical devices in the LD array 21, etc., to the soldering heat.

In this condition, burn-in is performed to determine whether the LD array 21 contains any defectives, and the LD devices confirmed to be non-defective are connected to the driver IC 30 by wire bonds (step S13). Next, the first fiber array 24 is fixed to the sub-substrate 23, and the two members are bonded to the silicon substrate 10' by active alignment and surface activation (step S14). In step S14, the LD array 21 is caused to emit laser light while changing the position of the sub-substrate 23 relative to the silicon substrate 10' and, based on the intensity of the light being emitted through the first fiber array 24, the position of the sub-substrate 23 relative to the silicon substrate 10' is determined. Further, the bonding of the sub-substrate 23 is reinforced by using an adhesive (step S15).

Then, ten optical fibers to be connected to the second fiber array 25 are selected from among the optical fibers in the first fiber array 24 that are connected to the LD devices confirmed to be non-defective in step S13 (step S16). The optical fibers in the second fiber array 25 are connected via the fiber connector 26 to the ten optical fibers selected in step S16 from the first fiber array 24 (step S17). Then, the fabrication process of the laser module 3 is terminated.

The burn-in in step S13 may be performed after the first fiber array 24 and sub-substrate 23 have been mounted on the silicon substrate 10' in step S14.

By configuring the LD devices and the optical fibers into arrays as described above, the laser module 3 has the advantage that the alignment between the LD devices and the optical fibers can be accomplished at once. Furthermore, since the LD array 21 specific to a particular one of the RGB colors is mounted on the silicon substrate 10' of a corresponding one of the laser modules 3R, 3G, and 3B, the LD devices for each of the RGB colors can be individually tested by burn-in, as in the case of conventional LD devices. Further, by designing the LD array 21 with redundancy so as to be able to perform the burn-in test after mounting the LD array 21 on the silicon substrate 10', the fabrication yield of the laser module can be further improved.

Since the laser modules 3R, 3G, and 3B are provided for the respective laser colors, the amount of redundancy to be incorporated into the design of the LD array 21 can be varied by considering the defect rate which differs depending on such factors as the materials, compositions, and structures of the laser devices of different colors. For example, there may arise a need to minimize the amount of redundancy for the green and blue lasers because their materials are expensive, while the amount of redundancy for the red laser may be allowed to increase because its material is inexpensive; with the above configuration, it becomes possible to flexibly address such a need.

Further, in the laser module 3 shown in FIG. 10 (the laser modules 3R, 3G, and 3B shown in FIG. 11), the LD array 20' of the one-piece structure shown in FIG. 7 may be used as the LD array 21.

Figure 13:
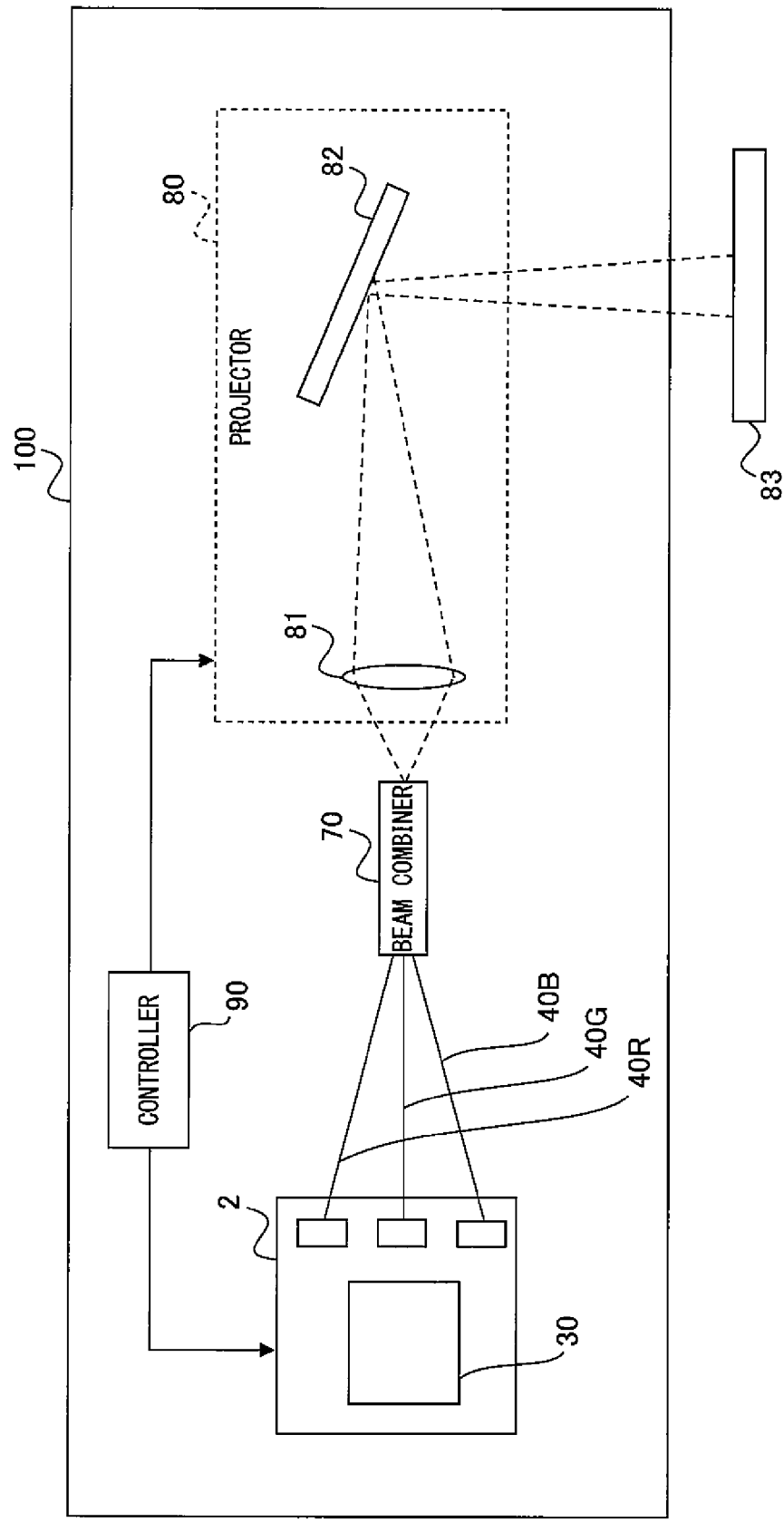
FIG. 13 is a diagram schematically illustrating the configuration of a projection device 100 incorporating the laser module 2.

FIG. 13 is a diagram schematically illustrating the configuration of a projection device 100 incorporating the laser module 2.

The projection device 100 is one example of a projection device that incorporates the laser module 2 as a light source and that can be applied as a volumetric display such as a near-to-eye display or a direct-view light field display or the like. The projection device 100 includes, in addition to the laser module 2, a beam combiner 70, a projector 80, and a controller 90.

Based on image signals supplied from the controller 90, the laser module 2 generates laser light beams of RGB colors for output. The laser light beams of the three colors are guided through the respective fiber arrays 40R, 40G, and 40B and input into the beam combiner 70. While the laser light beams of the three RGB colors have been used here, laser light outside the RGB wavelength range, for example, near-infrared laser light in the wavelength range of 790 nm to 930 nm, may also be used in addition to them.

The beam combiner 70 produces projection light by combining the RGB laser light beams onto a common optical axis, and directs the projection light to the projector 80. The beam combiner 70 may be constructed from a fused fiber combiner or from a fiber bundle combiner constructed by fixedly bundling together the ends of the fiber arrays 40R, 40G, and 40B. Alternatively, instead of the fiber bundle combiner, a multi-core fiber may be used.

The projector 80 projects an image onto a projection surface 83 by using the projection light produced by the beam combiner 70. The projector 80 includes, for example, a projection lens 81 and a MEMS scanner 82. The projection lens 81 shapes the projection light so that the projection light emitted from the beam combiner 70 will be projected onto the MEMS scanner 82. The MEMS scanner 82 is driven in a rapid, swinging fashion, for example, in the horizontal and vertical directions under the control of the controller 90 so that the projection light passed through the projection lens 81 will be scanned across the projection surface 83 in a two-dimensional manner. The scanning method may be either raster scanning or vector scanning.

The controller 90 includes a CPU, RAM, ROM, etc., and controls the operation of the projection device 100. More specifically, the controller 90 supplies image data to the laser module 2 and controls the emission timing of the LD arrays 20R, 20G, and 20B, and supplies control data to the projector 80 and controls the swing angle of the MEMS scanner 82. The desired image can thus be projected onto the projection surface 83 by using the laser module 2 as the light source.

Figure 14:
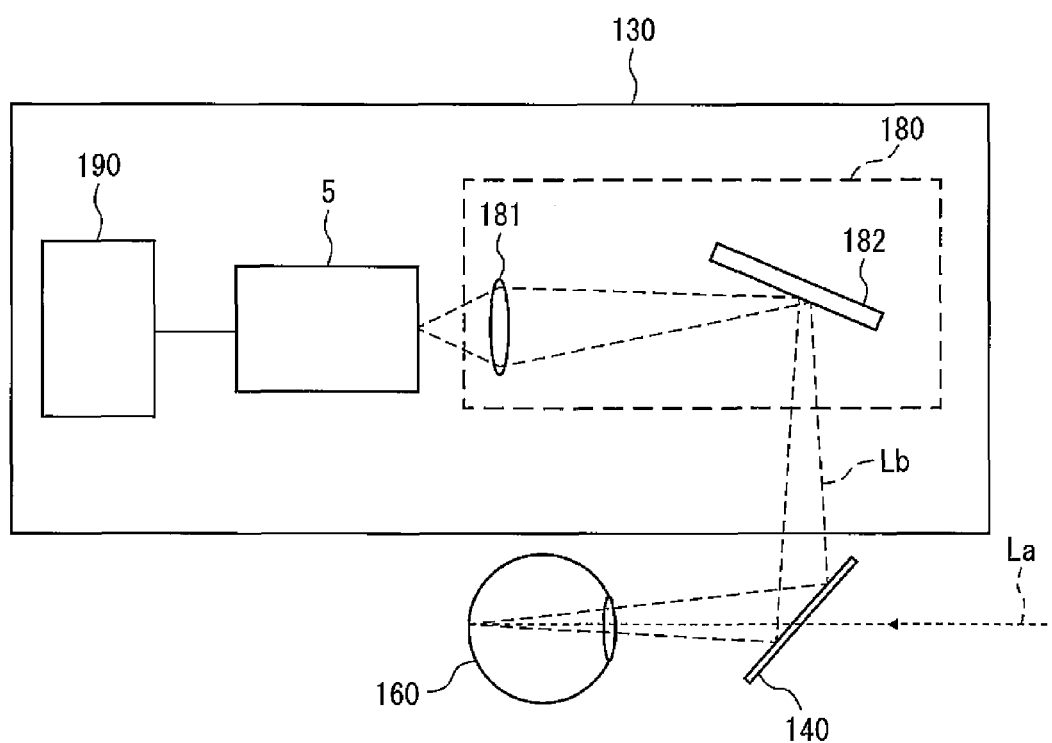
FIG. 14 is a diagram schematically illustrating the configuration of a projection unit 130 incorporating the light source device 5.
Figure 15:
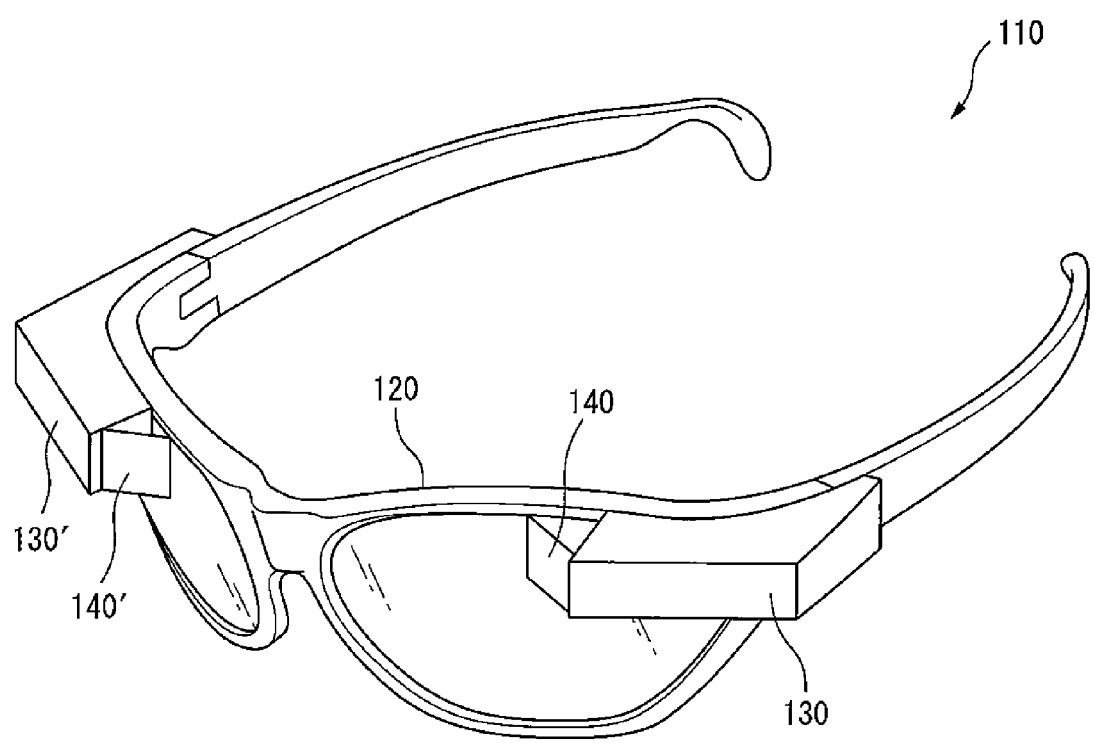
FIG. 15 is a diagram schematically illustrating the configuration of an eyeglass-type display 110 incorporating the projection unit 130.

FIG. 14 is a diagram schematically illustrating the configuration of a projection unit 130 incorporating the light source device 5. FIG. 15 is a diagram schematically illustrating the configuration of an eyeglass-type display 110 incorporating the projection unit 130.

The eyeglass-type display 110 is a near-to-eye (NTE) display which is mounted on the head of a user and which presents an image for viewing by projecting laser light onto the retina of the user's eye. As shown in FIG. 15, the eyeglass-type display 110 includes an eyeglass frame 120, projection units 130 and 130', and half-silvered mirrors 140 and 140'.

Like a conventional eyewear, the frame 120 has a head-mountable shape. The projection units 130 and 130' each have a substantially L-shaped structure and are mounted on the left and right eyeglasses, respectively. The half-silvered mirrors 140 and 140' are mounted on the ends of the respective projection units 130 and 130' in such a manner that when the frame 120 is mounted on the user's head, the half-silvered mirrors 140 and 140' are positioned so as to be opposite the user's left and right eyes, respectively. Since it is necessary to also reproduce binocular parallax in order to present a natural stereoscopic display, it goes without saying that the projection units for the left and right eyes are mounted and that different images created by considering the binocular parallax are displayed by the respective projection units. The projection unit 130' is identical in configuration to the projection unit 130 shown in FIG. 14.

The projection unit 130 shown in FIG. 14 incorporates a projector 180 and a controller 190 in addition to the light source device 5. The light source device 5 emits laser light of intensities proportional to image signals. The projector 180 scans the transmitted laser light to project an image into the user's left eye. Based on the image data of the image to be projected, the controller 190 controls the emission timing, emission intensity, etc., of the laser light of each color to be emitted from the light source device 5.

The projector 180 includes a projection lens 181 and a MEMS scanner 182. The projection lens 181 shapes the laser light of each color so that the laser light emitted from the light source device 5 will be projected onto the MEMS scanner 182. The MEMS scanner 182 is driven by a driver (not shown) in a rapid, swinging fashion, for example, in the horizontal and vertical directions. The MEMS scanner 182 deflects the laser light Lb of each color focused through the projection lens 181 and redirects it into the user's left eye 160, and scans the laser light over the retina of the user's eye in a two-dimensional fashion. In this way, the eyeglass-type display 110 uses the retina of the user' eye as the projection surface onto which the image is projected. The user views the image corresponding to the image signal through the light scanned over the retina.

As shown in FIG. 14, the laser light Lb emitted from the projector 180 is reflected by the half-silvered mirror 140 and enters the user's left eye 160, and at the same time, ambient light La passed through the half-silvered mirror 140 also enters the left eye. That is, the eyeglass-type display 110 is the so-called see-through type projection device that produces a display by superimposing the projected image produced by the laser light Lb onto the surrounding environment made visible by the ambient light La. However, this is only one example, and the projection device incorporating the light source device 5 need not be limited to the see-through type. It will also be noted that the light source device 5 is applicable for use in display or like devices other than the eyeglass type.

REFERENCE SIGNS LIST 1, 2, 3, 3R, 3G, 3B laser module
4 fiber bundle combiner
5 light source device
10, 10' silicon substrate
11 LD common electrode pad
12 LD individual electrode pad
13 test p-electrode pad
14 LD connection pad
15 driver electrode pad
16 test n-electrode pad
20, 20', 21 LD array
24, 25, 25R, 25G, 25B fiber array
26 fiber connector
30 driver IC
61, 64 wire bond
62, 63 feed-through electrode

What is claimed is:

1. A laser module comprising:
   a plurality of laser devices that emit laser light;
   a driver IC for driving the plurality of laser devices;
   a mounting substrate on which the plurality of laser devices and the driver IC are mounted;
   a common electrode terminal to which a common electrode of the plurality of laser devices is connected;
   a plurality of individual electrode terminals to which individual electrodes of the plurality of laser devices are respectively connected;
   a plurality of driver terminals to which the driver IC is connected; and
   a plurality of test terminals which are respectively connected to the common electrode terminal and the plurality of individual electrode terminals, and to which an external power supply is to be connected when performing burn-in of the plurality of laser devices, wherein
   the number of the plurality of laser devices and the number of the plurality of test terminals are each larger than the number of the plurality of driver terminals.

2. The laser module according to claim 1, wherein
   the plurality of laser devices, the common electrode terminal, and the plurality of individual electrode terminals are arranged on an upper surface of the mounting substrate, and
   the plurality of test terminals are arranged on a bottom surface of the mounting substrate, and are respectively connected to the common electrode terminal and the plurality of individual electrode terminals via feed-through electrodes formed passing through the mounting substrate from the upper surface to the bottom surface.

3. The laser module according to claim 1, wherein the plurality of driver terminals are selectively connected via wire bonds to individual electrode terminals corresponding to non-defective laser devices selected from among the plurality of laser devices.

4. The laser module according to claim 1, wherein
   the plurality of laser devices are mounted face down on the mounting substrate,
   n-electrodes of the plurality of laser devices are connected to the common electrode terminal, and
   p-electrodes of the plurality of laser devices are respectively connected to the plurality of individual electrode terminals.

5. A laser module comprising:
   a plurality of red laser devices that emit red laser light;
   a plurality of green laser devices that emit green laser light;
   a plurality of blue laser devices that emit blue laser light;
   a driver IC for driving the plurality of red laser devices, the plurality of green laser devices, and the plurality of blue laser devices;
   a mounting substrate on which the plurality of red laser devices, the plurality of green laser devices, the plurality of blue laser devices, and the driver IC are mounted;
   a common electrode terminal to which a common electrode of the plurality of red laser devices, the plurality of green laser devices, and the plurality of blue laser devices is connected;
   a plurality of individual electrode terminals to which individual electrodes of the plurality of red laser devices, the plurality of green laser devices, and the plurality of blue laser devices are respectively connected;
   a plurality of driver terminals to which the driver IC is connected; and
   a plurality of test terminals which are respectively connected to the common electrode terminal and the plurality of individual electrode terminals, and to which an external power supply is to be connected when performing burn-in of the plurality of red laser devices, the plurality of green laser devices, and the plurality of blue laser devices, wherein
   the number of the plurality of red laser devices, the number of the plurality of green laser devices, and the number of the plurality of blue laser devices and the number of the plurality of test terminals are each larger than the number of the plurality of driver terminals.

6. The laser module according to claim 1, further comprising:
   a plurality of first optical fibers which are arranged on the mounting substrate, and through each of which laser light from a corresponding one of the plurality of laser devices is guided;
   a fiber connector connected to end portions of the plurality of first optical fibers; and
   a plurality of second optical fibers connected to respective ones of the plurality of first optical fibers via the fiber connector, wherein
   the number of the plurality of laser devices and the number of the plurality of first optical fibers are each larger than the number of the plurality of second optical fibers.

7. A light source device comprising:
- the laser module of claim 6, wherein the plurality of laser devices are each a red laser device that emits red laser light, and the first and second optical fibers are respectively first and second red optical fibers through which the red laser light is guided;
- the laser module of claim 6, wherein the plurality of laser devices are each a green laser device that emits green laser light, and the first and second optical fibers are respectively first and second green optical fibers through which the green laser light is guided;
- the laser module of claim 6, wherein the plurality of laser devices are each a blue laser device that emits blue laser light, and the first and second optical fibers are respectively first and second blue optical fibers through which the blue laser light is guided; and
- a fiber bundle combiner which forms a fiber bundle by fixedly bundling together the plurality of second red optical fibers, the plurality of second green optical fibers, and the plurality of second blue optical fibers.

8. The light source device according to claim 7, wherein the amount of redundancy built into the number of the red laser devices and the number of the first red optical fibers with respect to the number of the second red optical fibers, the amount of redundancy built into the number of the green laser devices and the number of the first green optical fibers with respect to the number of the second green optical fibers, and the amount of redundancy built into the number of the blue laser devices and the number of the first blue optical fibers with respect to the number of the second blue optical fibers are different from each other.

9. The light source device according to claim 7, wherein the number of the second red optical fibers, the number of the second green optical fibers, and the number of the second blue optical fibers are the same.

10. The light source device according to claim 7, wherein
- the first and second red optical fibers, the first and second green optical fibers, and the first and second blue optical fibers are each a few-mode or single-mode optical fiber matched to a particular wavelength, and
- the first red optical fibers, the first green optical fibers, and the first blue optical fibers are each larger in diameter than the second red optical fibers, the second green optical fibers, and the second blue optical fibers, respectively.

11. A laser module fabrication method comprising the steps of:
- forming, on a mounting substrate, a common electrode terminal to which a common electrode of a plurality of laser devices that emit laser light is to be connected, a plurality of individual electrode terminals to which individual electrodes of the plurality of laser devices are to be respectively connected, a plurality of driver terminals to which a driver for driving the plurality of laser devices is to be connected, and a plurality of test terminals which are respectively connected to the common electrode terminal and the plurality of individual electrode terminals;
- mounting the plurality of laser devices and the driver IC on the mounting substrate; and
- connecting the plurality of test terminals to an external power supply and performing burn-in of the plurality of laser devices mounted on the mounting substrate, wherein
- the number of the plurality of laser devices and the number of the plurality of test terminals are each larger than the number of the plurality of driver terminals.

\* \* \* \* \*